(12) United States Patent
Saito et al.

(10) Patent No.: US 7,935,983 B2
(45) Date of Patent: May 3, 2011

(54) NITRIDE SEMICONDUCTOR DEVICE

(75) Inventors: Yasunobu Saito, Tokyo (JP); Wataru Saito, Kanagawa-ken (JP); Takao Noda, Kanagawa-ken (JP); Tomohiro Nitta, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 292 days.

(21) Appl. No.: 11/782,914

(22) Filed: Jul. 25, 2007

(65) Prior Publication Data
US 2008/0023706 A1 Jan. 31, 2008

(30) Foreign Application Priority Data
Jul. 26, 2006 (JP) .................................. 2006-202782

(51) Int. Cl.
*H01L 29/15* (2006.01)

(52) U.S. Cl. ................ 257/183; 257/192; 257/E29.253; 257/E51.015

(58) Field of Classification Search ................... 257/192, 257/194, 347, E29.246, E29.247, E29.249, 257/201, 76
See application file for complete search history.

(56) References Cited

U.S. PATENT DOCUMENTS

| | | | |
|---|---|---|---|
| 4,710,788 A * | 12/1987 | Dambkes et al. | 257/194 |
| 5,013,681 A * | 5/1991 | Godbey et al. | 438/459 |
| 6,713,326 B2 * | 3/2004 | Cheng et al. | 438/149 |
| 6,737,684 B1 * | 5/2004 | Takagi et al. | 257/194 |
| 7,038,252 B2 * | 5/2006 | Saito et al. | 257/192 |
| 7,135,720 B2 * | 11/2006 | Nagy et al. | 257/192 |
| 7,247,889 B2 * | 7/2007 | Hanson et al. | 257/189 |
| 7,348,259 B2 * | 3/2008 | Cheng et al. | 438/458 |
| 7,361,946 B2 | 4/2008 | Johnson et al. | 257/253 |
| 7,365,374 B2 * | 4/2008 | Piner et al. | 257/189 |
| 2002/0048289 A1 * | 4/2002 | Atanackovic et al. | 372/20 |
| 2002/0096692 A1 | 7/2002 | Nakamura et al. | |
| 2006/0170003 A1 | 8/2006 | Saito et al. | |
| 2006/0226415 A1 * | 10/2006 | Nishijima et al. | 257/11 |
| 2006/0226442 A1 * | 10/2006 | Zhang et al. | 257/192 |
| 2006/0249748 A1 * | 11/2006 | Piner et al. | 257/183 |
| 2006/0261356 A1 | 11/2006 | Iwakami et al. | |
| 2006/0261371 A1 * | 11/2006 | Kuroda et al. | 257/194 |

FOREIGN PATENT DOCUMENTS

| | | |
|---|---|---|
| JP | 2002-57158 | 2/2002 |
| JP | 2005-217049 | 8/2005 |
| JP | 2006-40932 | 2/2006 |
| JP | 2006-216671 | 8/2006 |

* cited by examiner

*Primary Examiner* — Leonardo Andújar
*Assistant Examiner* — William Harriston
(74) *Attorney, Agent, or Firm* — Oblon, Spivak, McClelland, Maier & Neustadt, L.L.P.

(57) ABSTRACT

A nitride semiconductor device includes: a substrate containing Si; a channel layer provided on the substrate and made of nitride semiconductor material; a barrier layer provided on the channel layer and made of nitride semiconductor material; a first and second main electrode connected to the barrier layer; and a control electrode provided between the first main electrode and the second main electrode on the barrier layer. The substrate includes at least one layer having a resistivity of 1 kΩ/cm or more.

15 Claims, 6 Drawing Sheets

NITRIDE SEMICONDUCTOR DEVICE

CROSS-REFERENCE TO RELATED APPLICATIONS

This application is based upon and claims the benefit of priority from the prior Japanese Patent Application No. 2006-202782, filed on Jul. 26, 2006; the entire contents of which are incorporated herein by reference.

BACKGROUND OF THE INVENTION

1. Field of the Invention

This invention relates to a nitride semiconductor device, and more particularly to a nitride semiconductor device having an Si substrate as its support substrate.

2. Background Art

Switching power supply and inverter circuits are based on power semiconductor devices such as switching devices and diodes. Power semiconductor devices require high breakdown voltage and low ON resistance. However, there is a tradeoff between breakdown voltage and ON resistance, and the performance limit of the device is determined by its material characteristics. In this regard, wide bandgap semiconductors such as GaN (gallium nitride), AlGaN (aluminum gallium nitride), and other nitride semiconductors or SiC (silicon carbide) and other carbide semiconductors can be used as the material of power semiconductor devices. It is then possible to improve the tradeoff determined by the material and to realize power semiconductor devices with low ON resistance and high breakdown voltage (see, e.g., JP 2002-057158A).

On the other hand, a power semiconductor device based on such wide bandgap semiconductor material often uses an expensive SiC substrate as its support substrate, and hence tends to increase device cost. For this reason, attempts are made to use an Si (silicon) substrate, which is less expensive and having the potential to increase the wafer diameter, as a support substrate for crystal growth of nitride semiconductor layers thereon. For example, in previous studies on fabricating lateral HFET (heterostructure field-effect transistor) or other semiconductor devices, an AlN layer as a buffer layer is epitaxially grown on an Si substrate as a support substrate. A GaN layer as a channel layer is epitaxially grown on the AlN layer. An AlGaN layer as a barrier layer is formed on the GaN layer. Finally, a source electrode, a drain electrode, and a gate electrode are formed on the AlGaN layer.

In such a semiconductor device, a high voltage may be applied between the support substrate located on the backside of the device and the drain electrode located on the frontside of the device. For this reason, it is necessary to ensure a sufficient breakdown voltage in the lamination direction of the device, that is, vertical breakdown voltage. Typically, the total thickness of the buffer layer and the channel layer is increased to improve the vertical breakdown voltage.

However, in this case, the substrate and the crystal growth layer (the buffer layer and the channel layer) grown thereon are different in materials. Hence the crystal growth layer is subjected to heteroepitaxial growth. The difference of lattice constant between the substrate and the crystal growth layer limits the thickness of the crystal growth layer that can be deposited on the substrate without defects. Furthermore, even if a crystal growth layer free from defects can be formed, the difference in lattice constant and thermal expansion coefficient causes warp in the Si wafer used as the substrate and results in process-related problems. Hence it is difficult for the buffer layer and the channel layer to have a thickness large enough to ensure a sufficient vertical breakdown voltage.

SUMMARY OF THE INVENTION

According to an aspect of the invention, there is provided a nitride semiconductor device including: a substrate containing Si; a channel layer provided on the substrate and made of nitride semiconductor material; a barrier layer provided on the channel layer and made of nitride semiconductor material; a first and second main electrode connected to the barrier layer; and a control electrode provided between the first main electrode and the second main electrode on the barrier layer, the substrate including at least one layer having a resistivity of 1 kΩ/cm or more.

According to another aspect of the invention, there is provided a nitride semiconductor device including: a substrate including: a conductive Si substrate; an insulating layer provided on the conductive Si substrate, the insulating layer having a resistivity of 1 kΩ·cm or more; and an Si layer provided on the insulating layer; a channel layer provided on the substrate and made of nitride semiconductor material; a barrier layer provided on the channel layer and made of nitride semiconductor material; a first and second main electrode connected to the barrier layer; and a control electrode provided between the first main electrode and the second main electrode on the barrier layer.

According to another aspect of the invention, there is provided a nitride semiconductor device including: a substrate including: a conductive substrate; and an insulating layer provided on the conductive substrate, the insulating layer having a resistivity of 1 kΩ·cm or more; a channel layer provided on the substrate and made of nitride semiconductor material; a barrier layer provided on the channel layer and made of nitride semiconductor material; a first main electrode connected to the conductive substrate and the barrier layer; a second main electrode connected to the barrier layer; and a control electrode provided between the first main electrode and the second main electrode on the barrier layer.

DETAILED DESCRIPTION OF THE INVENTION

Figure 1:
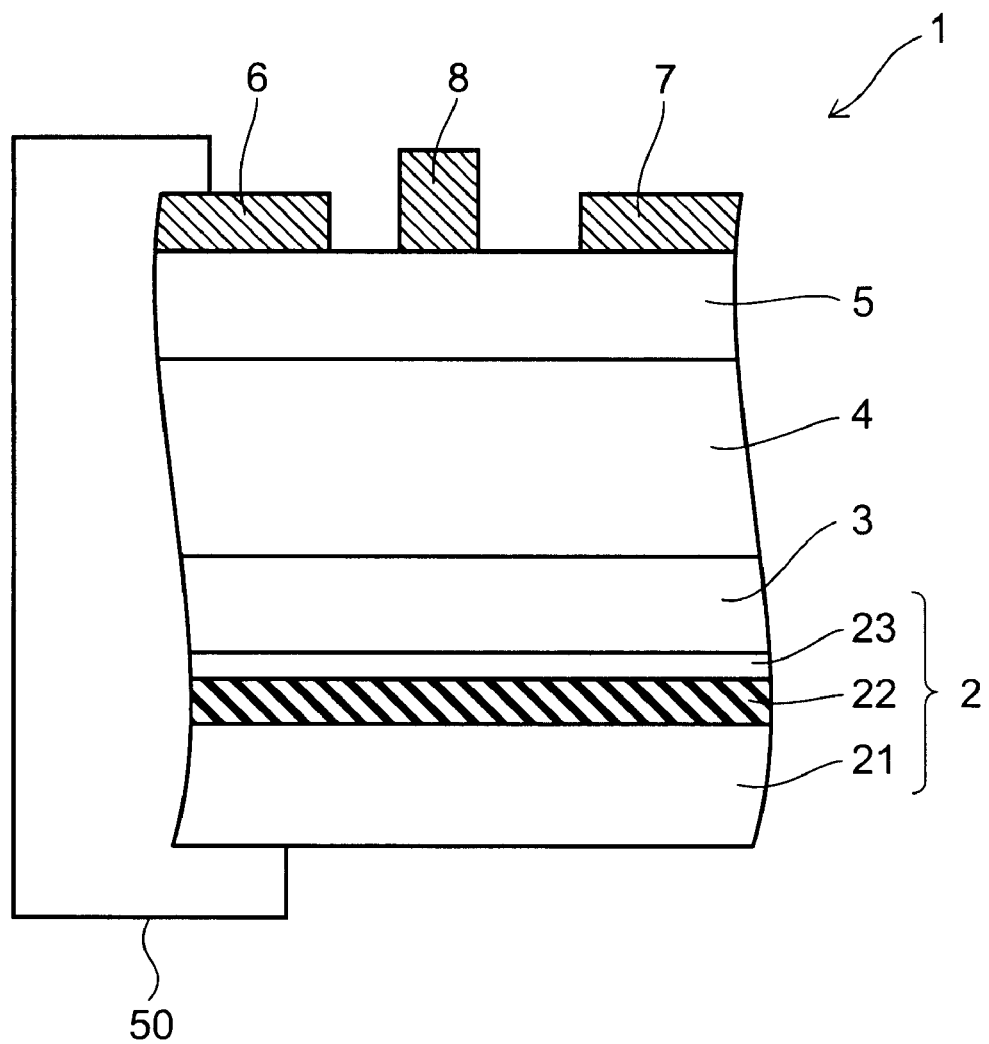
FIG. 1 is a cross-sectional view illustrating a nitride semiconductor device according to a first embodiment of the invention.

Embodiments of the invention will now be described with reference to the drawings. Like elements in the drawings are marked with like reference numerals.

First Embodiment

FIG. 1 is a cross-sectional view illustrating a nitride semiconductor device according to a first embodiment of the invention.

The nitride semiconductor device according to this embodiment is illustratively a lateral GaN-HFET.

As shown in FIG. 1, the nitride semiconductor device 1 according to this embodiment includes an SOI (silicon on insulator) substrate 2 as a support substrate. The SOI substrate 2 includes a conductive Si substrate 21, an SiO$_2$ layer 22 on the conductive Si substrate 21, and an Si layer 23 on the SiO$_2$ layer 22. The conductive Si substrate 21 is formed from n-type or p-type conductive Si, and has a resistivity of e.g. less than 1 Ωcm. The SiO$_2$ layer 22 is an insulating layer, having a resistivity of 1 kΩ·cm or more and a thickness of e.g. 1 μm (micron). The Si layer 23 has a thickness of e.g. 0.1 μm or less. Because the SOI substrate 2 includes the SiO$_2$ layer 22, the SOI substrate 2 is insulative in its thickness direction, but conductive in the direction parallel to its surface.

On the SOI substrate 2, an AlN layer 3 is provided as a buffer layer. However, the buffer layer is not limited to the AlN layer, but may be an AlGaN layer or a GaN layer, for example. An undoped GaN layer 4 is provided as a channel layer on the AlN layer 3, and an undoped AlGaN layer 5 is provided as a barrier layer on the GaN layer 4. On the AlGaN layer 5, a source electrode 6 and a drain electrode 7 are spaced from each other and connected to the AlGaN layer 5 by ohmic contact. Furthermore, a gate electrode 8 is provided between the source electrode 6 and the drain electrode 7 on the AlGaN layer 5. The gate electrode 8 is a control electrode, the potential of which controls current flowing in the GaN layer 4. The gate electrode 8 is connected to the AlGaN layer 5 by Schottky junction. The conductive Si substrate 21 of the SOI substrate 2 is connected to the source electrode 6 through an interconnect 50.

The reason for setting the thickness of the Si layer 23 to 0.1 μm or less is as follows. Because Si has a narrower bandgap than GaN, Si is more susceptible to "avalanche breakdown" than GaN. Hence, if the Si layer 23 is too thick, the Si layer 23 allows carriers therein to have a sufficient distance for acceleration and produces carriers with sufficient energy. Thus "avalanche breakdown" occurs more easily in the Si layer 23 and consequently causes leak current. To avoid this, the thickness of the Si layer 23 is preferably 0.1 μm or less.

Next, a description is given of the function and effect of the nitride semiconductor device 1 according to this embodiment configured as above.

First, a voltage is applied between the source electrode 6 and the drain electrode 7. In this state, by applying a voltage not exceeding a prescribed threshold to the gate electrode 8, a two-dimensional electron gas (2DEG) is produced in the GaN layer 4 near its interface with the AlGaN layer 5. Thus a current flows between the source electrode 6 and the drain electrode 7.

At this time, the conductive Si substrate 21 is connected to the source electrode 6, and has high conductivity in the direction parallel to its surface (hereinafter also referred to as "lateral direction"). Hence the conductive Si substrate 21 functions as a field plate electrode. Thus it is possible to alleviate electric field concentration on the edge of the gate electrode 8, and to improve the breakdown voltage of the nitride semiconductor device 1.

However, because the conductive Si substrate 21 is connected to the source electrode 6, application of voltage between the source electrode 6 and the drain electrode 7 also results in application of voltage between the conductive Si substrate 21 and the drain electrode 7, and produces electric field in the lamination direction of the layers in the nitride semiconductor device 1 (hereinafter also referred to as "vertical direction").

Here, if the SiO$_2$ layer 22 were not provided between the conductive Si substrate 21 and the drain electrode 7, the breakdown voltage against this vertical electric field would have to be ensured only by the AlN layer 3 and the GaN layer 4, and hence the total thickness of the AlN layer 3 and the GaN layer 4 (hereinafter also referred to as "epitaxial thickness") would have to be increased. However, as described in the Background section, the AlN layer 3 and the GaN layer 4 are heteroepitaxial on the Si layer 23 of the SOI substrate 2, and hence it is difficult to thickly form them without crystal defects. Furthermore, thick formation increases deposition cost and causes warp in the wafer used as a substrate. Here, it may be possible to increase epitaxial thickness with preventing wafer warp by elaboration of the structure of the buffer layer. However, this will require a thick buffer layer with complicated structure, which further increases deposition cost.

In contrast, according to this embodiment, an SiO$_2$ layer 22 is provided between the conductive Si substrate 21 and the drain electrode 7. Hence the breakdown voltage against vertical electric field can be shared with the SiO$_2$ layer 22. That is, the breakdown voltage against vertical electric field can be shared between two portions: the portion of the SiO$_2$ layer 22 and the portion of the AlN layer 3 and the GaN layer 4. Thus the thickness of the AlN layer 3 and the GaN layer 4 can be decreased relative to the case without the SiO$_2$ layer 22.

In the following, this effect is quantitatively described with reference to a numerical example.

Figure 2:
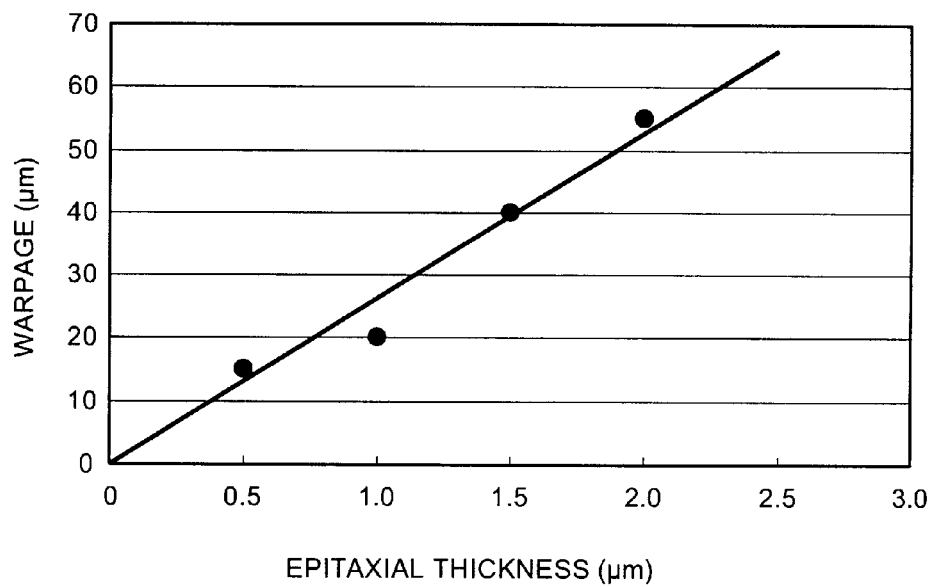
FIG. 2 is a graph illustrating the relationship between epitaxial thickness and wafer warp, where the horizontal axis represents the total thickness (epitaxial thickness) of the buffer layer (AlN layer 3) and the channel layer (GaN layer 4), and the vertical axis represents the warpage of a wafer (SOI substrate 2) having a diameter of 3 inches.

FIG. 2 is a graph illustrating the relationship between epitaxial thickness and wafer warp, where the horizontal axis represents the total thickness (epitaxial thickness) of the buffer layer (AlN layer 3) and the channel layer (GaN layer 4), and the vertical axis represents the warpage of a wafer (SOI substrate 2) having a diameter of 3 inches.

Here, the warpage of a wafer refers to the value obtained by subtracting the thickness of the wafer from the maximum height of the wafer when the warped wafer is mounted on a horizontal plane so that its center is higher than its periphery.

As shown in FIG. 2, the warpage of a wafer is nearly proportional to epitaxial thickness. When a voltage of e.g. 600 V (volts) is applied vertically to the nitride semiconductor device 1, epitaxial thickness needs to be 2 μm or more for withstanding this voltage. In this case, as shown in FIG. 2, wafer warpage is 50 μm or more. However, this warpage exceeds the allowable value of the stepper, and makes exposure difficult.

In contrast, according to this embodiment, when the thickness of the SiO$_2$ layer 22 is e.g. 1 μm, this SiO$_2$ layer 22 can withstand a voltage of 200 to 300 V, and hence the AlN layer 3 and the GaN layer 4 only need to withstand a voltage of 300 to 400 V. An epitaxial thickness of 1.5 μm is sufficient for withstanding a voltage of 400 V. In this case, from FIG. 2, wafer warpage can be reduced to about 40 μm. Hence this embodiment facilitates exposure by the stepper. Furthermore, reduction of epitaxial thickness facilitates formation of film free from defects and can reduce deposition cost.

Thus, according to this embodiment, because the support substrate uses an Si-based substrate, it is possible to reduce the material cost of the support substrate and to form devices on a wafer having a large diameter. Hence the manufacturing cost per device can be reduced. Furthermore, because an SOI substrate is used as a support substrate, sufficient conductivity is ensured in the lateral direction of the device to allow the substrate to function as a field plate electrode, while insulativity is provided in the vertical direction of the device to share the vertical breakdown voltage. Thus, with ensuring a sufficient vertical breakdown voltage of the device, it is possible to decrease the thickness of the AlN layer 3 and the GaN layer 4 (epitaxial thickness), thereby reducing deposition cost. Hence this embodiment can provide a nitride semiconductor device with low cost and high vertical breakdown voltage.

Next, examples for realizing the nitride semiconductor device according to this embodiment are described, beginning with a first example of this embodiment.

Figure 3:
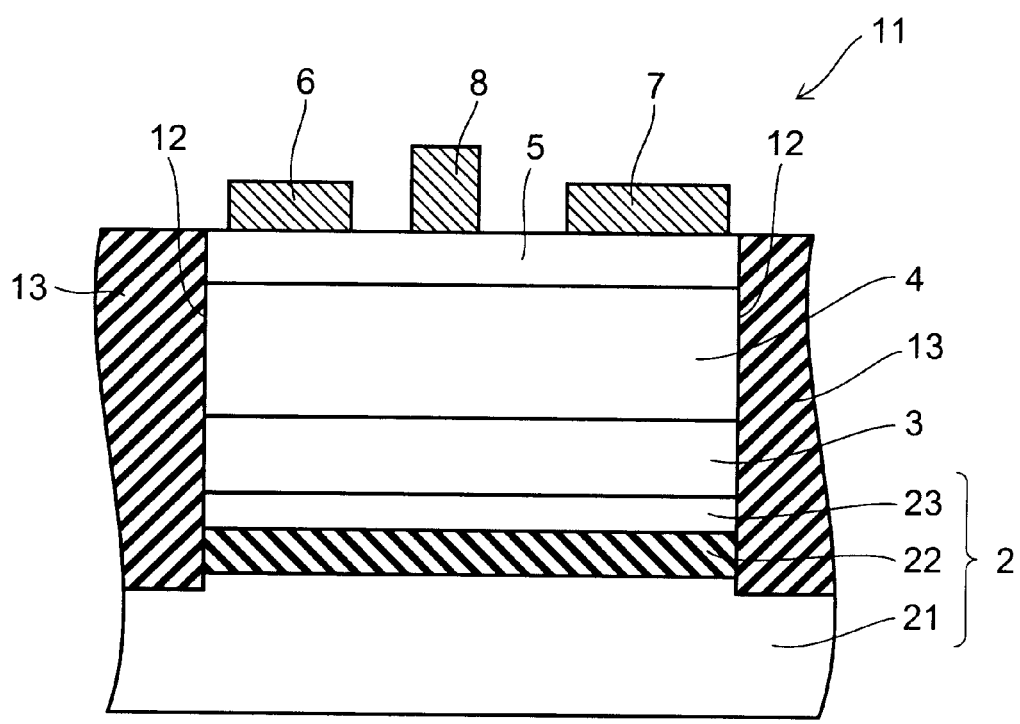
FIG. 3 is a cross-sectional view illustrating an HFET according to an example of the embodiment.

FIG. 3 is a cross-sectional view illustrating an HFET according to this example.

The nitride semiconductor device according to this example is a lateral power HFET. Among the components shown in FIG. 3, the same components as those of the first embodiment shown in FIG. 1 are marked with like reference numerals and not described in detail.

As shown in FIG. 3, the HFET 11 according to this example includes a trench 12 reaching the conductive Si substrate 21 from the upper side. The trench 12 is filled with insulator to serve as a device isolation film 13. The device isolation film 13 is buried in the AlN layer 3 (buffer layer), the GaN layer 4 (channel layer), and the AlGaN layer 5 (barrier layer). The lower end of the device isolation film 13 reaches the conductive Si substrate 21 and is in contact with the $SiO_2$ layer 22. The device isolation film 13 surrounds the region including the portion directly below the source electrode 6, the drain electrode 7, and the gate electrode 8. Thus the device isolation film 13 forms a top opening box-like insulation structure along with the $SiO_2$ layer 22. The insulator buried in the trench 12 is illustratively $SiO_2$, but is not limited thereto. It is also possible to form the wall of the trench 12 from $SiO_2$ and to fill in the trench 12 with Si.

In the HFET 11, the Si layer 23 is formed from undoped Si. The source electrode 6 and the drain electrode 7 are illustratively formed from a two-layer film in which a Ti layer and an Al layer are laminated, a three-layer film in which a Ti layer, an Al layer, and a Ti layer are laminated in this order, or a two-layer film in which a Ta layer and a Mo layer are laminated. The gate electrode 8 is illustratively formed from a two-layer film in which a Ni layer and an Au layer are laminated.

According to this example, in addition to the function and effect of the first embodiment described above, isolation between devices can be ensured by the device isolation film 13 and the $SiO_2$ layer 22.

Next, a second example of the first embodiment is described with reference to FIG. 3.

In this example, the Si layer 23 of the SOI substrate 2 is formed from n-type Si. In this case, the Si layer 23 has a sheet doping concentration of less than $1\times10^{11}$ $cm^{-2}$. The configuration of this example other than the foregoing is the same as that of the first example described above.

The reason for this numerical limitation is described in the following.

When the conductivity type of the Si layer 23 is n-type, electrons are present in the Si layer 23 as in the GaN layer 4 and produces electric field, which has an effect of enhancing the electric field in the device. Hence the electric field increases the leak current of the device and decreases breakdown voltage. For this reason, when the Si layer 23 is formed from n-type Si, it is preferable that the sheet concentration of electrons induced in the Si layer 23 be sufficiently lower than the sheet concentration of 2DEG induced at the heterointerface between the AlGaN layer 5 and the GaN layer 4 (AlGaN/GaN interface), specifically less than 1% thereof. Typically, the sheet concentration of 2DEG induced at the AlGaN/GaN interface is about $1\times10^{13}$ $cm^{-2}$. Hence the sheet doping concentration in the Si layer 23 is preferably less than $1\times10^{11}$ $cm^{-2}$.

Next, a third example of the first embodiment is described with reference to FIG. 3.

In this example, the Si layer 23 of the SOI substrate 2 is formed from p-type Si. In this case, the Si layer 23 has a sheet doping concentration of $1\times10^{11}$ to $1\times10^{13}$ $cm^{-2}$. The configuration of this example other than the foregoing is the same as that of the first example described above.

The reason for this numerical limitation is described in the following.

When the conductivity type of the Si layer 23 is p-type, holes are present in the Si layer 23, and electric field due to the two-dimensional electron gas (2DEG) in the GaN layer 4 can be terminated at this Si layer 23. As a result, electric field in the device can be weakened and made uniform, and the electric field concentrated on the edge of the gate electrode 8 can be weakened, for example.

To achieve this effect, the sheet concentration of holes induced in the Si layer 23 needs to reach a certain level. Specifically, the sheet concentration of holes in the Si layer 23 is preferably 1% or more of the sheet concentration of 2DEG induced at the AlGaN/GaN interface, and not more than the sheet concentration of this 2DEG. Typically, the sheet concentration of 2DEG induced at the AlGaN/GaN interface is about $1\times10^{13}$ $cm^{-2}$. Hence the sheet doping concentration in the Si layer 23 is preferably $1\times10^{11}$ to $1\times10^{13}$ $cm^{-2}$.

Next, a fourth example of the first embodiment is described.

Figure 4:
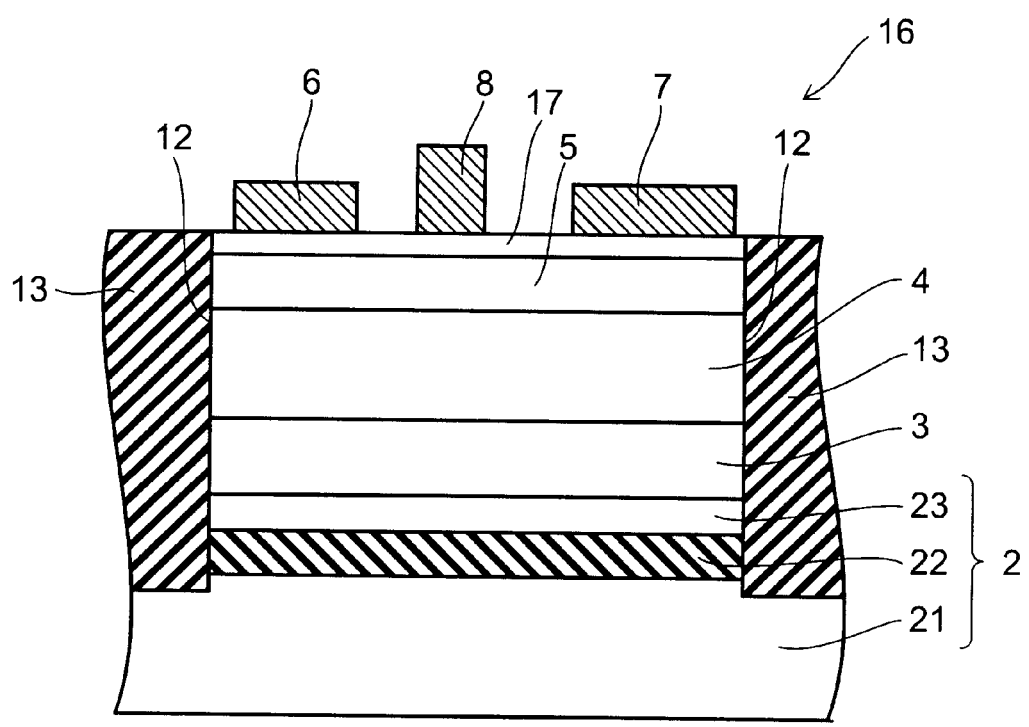
FIG. 4 is a cross-sectional view illustrating an HFET according to an fourth example of the embodiment.

FIG. 4 is a cross-sectional view illustrating an HFET according to this example. Among the components shown in FIG. 4, the same components as those of the first example shown in FIG. 3 are marked with like reference numerals and not described in detail.

As shown in FIG. 4, the HFET 16 according to this example includes a GaN layer 17 as a cap layer on the AlGaN layer 5. The source electrode 6, the drain electrode 7, and the gate electrode 8 are provided on and connected to the GaN layer 17. Thus the HFET 16 has a GaN/AlGaN/GaN heterostructure. According to this example, the AlGaN layer 5 can be stabilized because the surface of the AlGaN layer 5 is covered with the GaN layer 17.

Next, a fifth example of the first embodiment is described.

Figure 5:
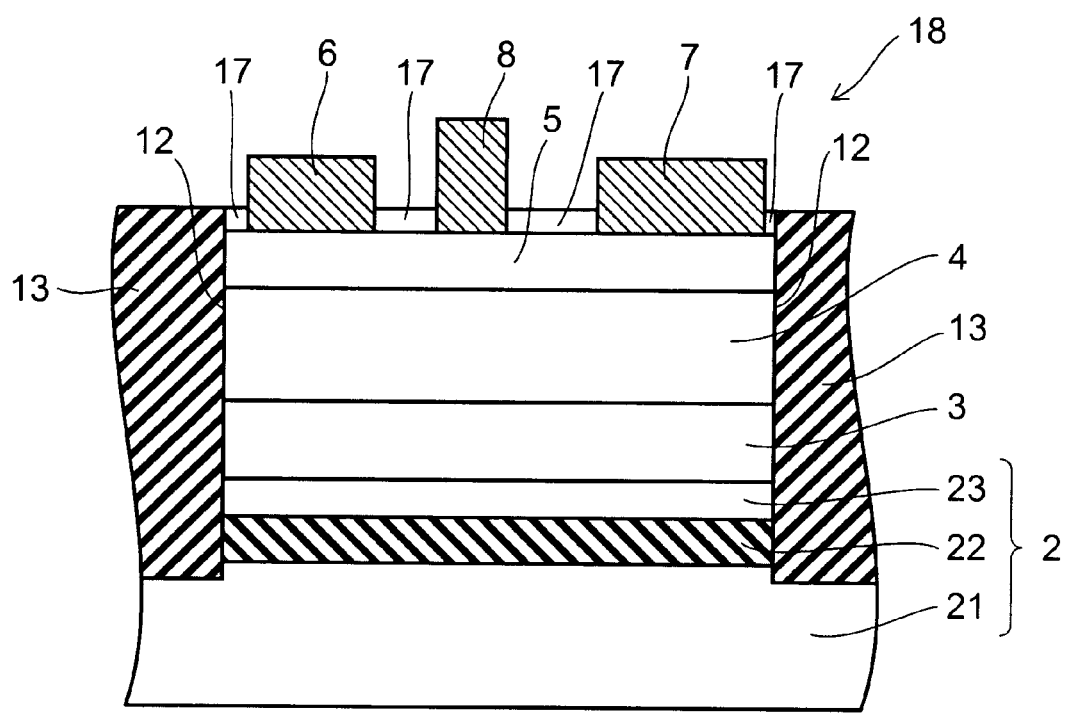
FIG. 5 is a cross-sectional view illustrating an HFET according to fifth example.

FIG. 5 is a cross-sectional view illustrating an HFET according to this example. Among the components shown in FIG. 5, the same components as those of the first example shown in FIG. 3 are marked with like reference numerals and not described in detail.

As shown in FIG. 5, the HFET 18 according to this example includes a GaN layer 17 as a cap layer on the AlGaN layer 5 outside the region where the source electrode 6, the drain electrode 7, and the gate electrode 8 are provided. The source electrode 6, the drain electrode 7, and the gate electrode 8 are connected to the AlGaN layer 5. That is, the surface of the AlGaN layer 5 is covered with one of the source electrode 6, the drain electrode 7, the gate electrode 8, and the GaN layer 17. According to this example, the AlGaN layer 5 can thus be stabilized.

Second Embodiment

Figure 6:
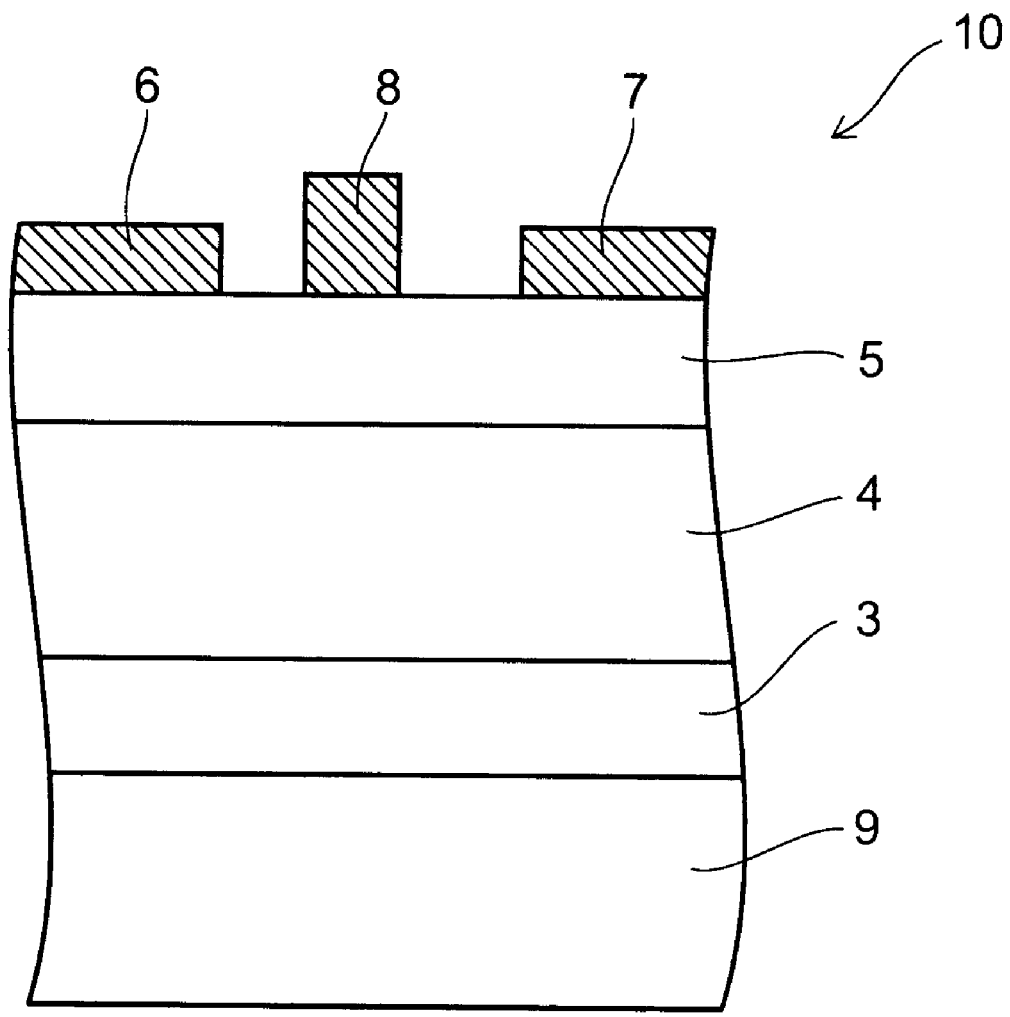
FIG. 6 is a cross-sectional view illustrating a nitride semiconductor device according to an second embodiment.

Next, a second embodiment of the invention is described.
FIG. 6 is a cross-sectional view illustrating a nitride semiconductor device according to this embodiment. Among the components shown in FIG. 6, the same components as those of the first embodiment shown in FIG. 1 are marked with like reference numerals and not described in detail.

As shown in FIG. 6, the nitride semiconductor device 10 according to this embodiment includes a high-resistance Si substrate 9 as a support substrate. The high-resistance Si substrate 9 is formed from a single material having a resistivity of 1 kΩ·cm or more, and is illustratively formed from undoped Si. On this high-resistance Si substrate 9, as in the first embodiment described above, an AlN layer 3 as a buffer layer, a GaN layer 4 as a channel layer, and an AlGaN layer 5 as a barrier layer are provided, and a source electrode 6, a drain electrode 7, and a gate electrode 8 are provided thereon. The high-resistance Si substrate 9 is connected to the source electrode 6.

According to this embodiment, by using an Si substrate (high-resistance Si substrate 9) for the support substrate of the device, it is possible to reduce the material cost of the support substrate and to form devices on a wafer having a large diameter. Hence the manufacturing cost of the device can be reduced.

Furthermore, because the high-resistance Si substrate 9 has a resistivity of 1 kΩ·cm or more, the breakdown voltage against vertical electric field can be shared with the high-resistance Si substrate 9. Thus it is possible to decrease the thickness of the AlN layer 3 and the GaN layer 4 (epitaxial thickness) relative to the case of using a support substrate having a resistivity of less than 1 kΩ·cm.

Also in this embodiment, a device isolation film may be provided as in the first example of the first embodiment described above, and/or a cap layer may be provided as in the fourth and fifth example.

The features of the invention have been described with reference to the first and second embodiment and the examples thereof. However, the invention is not limited to these embodiments and examples. Any other variations readily devised by those skilled in the art are encompassed within the scope of the invention as long as they include the features of the invention.

For example, the buffer layer can be configured as any layer combinations of an AlN layer, an AlGaN layer, and/or a GaN layer. Any thickness thereof is possible as long as a channel layer having good crystal quality can be formed on the buffer layer.

In the above embodiments and examples, the barrier layer is illustratively formed from undoped AlGaN. However, the barrier layer may be formed from n-type AlGaN. The Al composition ratio in AlGaN is arbitrary.

Furthermore, the structure of each electrode is arbitrary. For example, the gate portion may have a gate structure other than the planar Schottky gate structure, such as the recess gate structure or the MIS gate structure, and may have an upper structure such as a field plate electrode.

The above embodiments and examples illustrate the combination of AlGaN/GaN where the barrier layer is an AlGaN layer and the channel layer is a GaN layer. However, the invention is not limited thereto. Other combinations of nitride semiconductor materials are possible, such as the combination of GaN/InGaN and the combination of AlN/AlGaN.

In the above embodiments and examples, the nitride semiconductor device is illustratively a lateral HFET having a simple AlGaN/GaN heterostructure or having a GaN/AlGaN/GaN heterostructure including a GaN cap layer. However, the invention is not limited thereto. For example, because the gate-drain structure of the HFET described in the above embodiments is similar to the structure of a lateral heterostructure Schottky barrier diode (HSBD), the nitride semiconductor device according to the invention can be configured as an HSBD. By using the structure of the invention, an HSBD with low cost and high breakdown voltage can be realized. The invention is particularly suitable for devices to which high voltage is vertically applied, because advantageous effects similar to those in the above embodiments can be achieved.

The "nitride semiconductor material" used herein includes semiconductor materials having any composition represented by the chemical formula $In_xAl_yGa_{1-x-y}N$ ($0 \leq x \leq 1$, $0 \leq y \leq 1$, $x+y \leq 1$) where the composition ratios x and y are varied in the respective ranges. Furthermore, the "nitride semiconductor material" also includes nitride semiconductor materials mixed with at least one of boron (B), arsenic (As), phosphorus (P), and various other dopants. For example, silicon (Si) can be used as a dopant for n-type nitride semiconductor material, magnesium (Mg) can be used as a dopant for p-type nitride semiconductor material, and carbon (C) can be used as a dopant for insulating nitride semiconductor material.

The invention claimed is:

1. A nitride semiconductor device comprising:
   a substrate containing Si;
   a channel layer provided on the substrate and made of nitride semiconductor material;
   a barrier layer provided on the channel layer and made of nitride semiconductor material;
   a first and second main electrode connected to the barrier layer;
   a control electrode provided between the first main electrode and the second main electrode on the barrier layer; and
   an interconnect,
   the substrate including at least one layer having a resistivity of 1 kΩ·cm or more,
   wherein the substrate includes:
      a conductive Si substrate that has a resistivity less than 1 Ω·cm, and is electrically connected to the first main electrode through the interconnect;
      an insulating layer provided on the conductive Si substrate; and
      an Si layer provided on the insulating layer,
   wherein the Si layer is one of an n-type Si layer having a sheet doping concentration of less than $1 \times 10^{11}$ $cm^{-2}$ and a p-type Si layer having a sheet doping concentration of $1 \times 10^{11}$ to $1 \times 10^{13}$ $cm^{-2}$.

2. The nitride semiconductor device according to claim 1, wherein the insulating layer is formed from silicon oxide.

3. The nitride semiconductor device according to claim 1, wherein a thickness of the Si layer is 0.1 micrometers or less.

4. The nitride semiconductor device according to claim 1, wherein the Si layer is made from undoped Si.

5. A nitride semiconductor device comprising:
   a substrate containing Si;
   a channel layer provided on the substrate and made of nitride semiconductor material;
   a barrier layer provided on the channel layer and made of nitride semiconductor material;
   a first and second main electrode connected to the barrier layer; and
   a control electrode provided between the first main electrode and the second main electrode on the barrier layer;
   the substrate including at least one layer having a resistivity of 1 kΩ·cm or more,
   wherein the substrate includes:
      a conductive Si substrate that has a resistivity less than 1 Ω·cm;

an insulating layer provided on the conductive Si substrate;

an Si layer provided on the insulating layer, and wherein the Si layer is one of an n-type Si layer having a sheet doping concentration of less than $1 \times 10^{11}$ cm$^{-2}$ and a p-type Si layer having a sheet doping concentration of $1 \times 10^{11}$ to $1 \times 10^{13}$ cm$^{-2}$.

6. The nitride semiconductor device according to claim 1, further comprising: a device isolation film buried in the channel layer and the barrier layer and being in contact with the insulating layer.

7. The nitride semiconductor device according to claim 6, wherein the device isolation film surrounds a region including a portion directly below the first main electrode, second main electrode, and the control electrode.

8. The nitride semiconductor device according to claim 1, wherein the channel layer is GaN layer and the barrier layer is AlGaN layer.

9. A nitride semiconductor device comprising:

a substrate containing Si;

a channel layer provided on the substrate and made of nitride semiconductor material;

a barrier layer provided on the channel layer and made of nitride semiconductor material;

a first and second main electrode connected to the barrier layer; and a control electrode provided between the first main electrode and the second main electrode on the barrier layer, the substrate including at least one layer having a resistivity of 1 kΩ·cm or more, wherein the substrate includes:

a conductive Si substrate;

an insulating layer provided on the conductive Si substrate; and an Si layer provided on the insulating layer, the Si layer is an n-type Si layer having a sheet doping concentration of less than $1 \times 10^{11}$ cm$^{-2}$ or a p-type Si layer having a doping concentration of $1 \times 10^{11}$ to $1 \times 10^{13}$ cm$^{-2}$.

10. The nitride semiconductor device according to claim 9, wherein the insulating layer is formed from silicon oxide.

11. The nitride semiconductor device according to claim 9, wherein the Si layer is made from undoped Si.

12. The nitride semiconductor device according to claim 9, further comprising:

a device isolation film buried in the channel layer and the barrier layer and in contact with the insulating layer.

13. The nitride semiconductor device according to claim 12, wherein the device isolation film surrounds a region including a portion directly below the first main electrode, second main electrode, and the control electrode.

14. The nitride semiconductor device according to claim 9, wherein the channel layer is a GaN layer and the barrier layer is a AlGaN layer.

15. The nitride semiconductor device according to claim 9, wherein a thickness of the Si layer is 0.1 micrometers or less.

\* \* \* \* \*